US012704539B2

(12) United States Patent
Choi et al.

(10) Patent No.: US 12,704,539 B2
(45) Date of Patent: Aug. 11, 2026

(54) BATTERY APPARATUS AND BATTERY MANAGEMENT SYSTEM FOR MEASURING INSULATION RESISTANCE

(71) Applicant: LG Energy Solution, Ltd., Seoul (KR)

(72) Inventors: Jang Hyeok Choi, Daejeon (KR); Tae Youn Kim, Daejeon (KR); Minwoo Kim, Daejeon (KR); Yeondo Park, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 152 days.

(21) Appl. No.: 18/711,243

(22) PCT Filed: Jan. 5, 2023

(86) PCT No.: PCT/KR2023/000250
§ 371 (c)(1),
(2) Date: May 17, 2024

(87) PCT Pub. No.: WO2023/132670
PCT Pub. Date: Jul. 13, 2023

(65) Prior Publication Data

US 2025/0027984 A1 Jan. 23, 2025

(30) Foreign Application Priority Data

Jan. 6, 2022 (KR) ........................ 10-2022-0002135

(51) Int. Cl.
*G01R 31/14* (2006.01)
*G01R 31/3835* (2019.01)
(Continued)

(52) U.S. Cl.
CPC ......... *G01R 31/14* (2013.01); *G01R 31/3835* (2019.01); *H01M 10/425* (2013.01); *H01M 10/482* (2013.01); *H01M 2010/4271* (2013.01)

(58) Field of Classification Search
CPC ........ G01R 31/14; G01R 31/02; G01R 31/28; G01R 31/3835; H01M 10/425; H01M 10/482; H01M 2010/4271
(Continued)

(56) References Cited

U.S. PATENT DOCUMENTS 9,024,769 B2 5/2015 Hong et al.
10,890,612 B2 1/2021 Lin et al.
(Continued)

FOREIGN PATENT DOCUMENTS

EP 2796887 B1 11/2019
JP 2006220520 A 8/2006
(Continued)

OTHER PUBLICATIONS

International Search Report for PCT/KR2023/000250 mailed Apr. 11, 2023. 3 pages.
(Continued)

*Primary Examiner* — Lee E Rodak
*Assistant Examiner* — Taqi R Nasir
(74) *Attorney, Agent, or Firm* — Lerner David LLP

(57) ABSTRACT

A first insulation resistance monitoring circuit includes a first resistor connected between a positive terminal of a battery pack and a node, and connected between the positive terminal of the battery pack and a ground terminal of an external device, and has a first monitoring terminal. A second insulation resistance monitoring circuit is connected between the ground terminal and the negative terminal of the battery pack, and has a second monitoring terminal. A voltage monitoring circuit is connected between the node and the negative terminal of the battery pack, and has a third monitoring terminal. A processor measures the voltage of the battery pack.

18 Claims, 7 Drawing Sheets

(51) Int. Cl.
*H01M 10/42* (2006.01)
*H01M 10/48* (2006.01)

(58) Field of Classification Search
USPC .............................. 324/536, 537, 514, 158.1
See application file for complete search history.

(56) References Cited

U.S. PATENT DOCUMENTS

| | | | | |
|---|---|---|---|---|
| 2008/0088280 | A1* | 4/2008 | Wan | H02J 7/663 320/136 |
| 2014/0095093 | A1 | 4/2014 | Hong et al. | |
| 2014/0159908 | A1 | 6/2014 | Hong et al. | |
| 2019/0047436 | A1 | 2/2019 | Song | |
| 2020/0116791 | A1 | 4/2020 | Song | |
| 2020/0144812 | A1 | 5/2020 | Shin | |
| 2020/0217893 | A1* | 7/2020 | Song | H01M 10/48 |
| 2020/0292623 | A1 | 9/2020 | Jang et al. | |
| 2021/0318372 | A1 | 10/2021 | Kim | |
| 2022/0146561 | A1 | 5/2022 | Ock et al. | |
| 2022/0179006 | A1 | 6/2022 | Jang et al. | |

FOREIGN PATENT DOCUMENTS

| | | | | | |
|---|---|---|---|---|---|
| JP | 2010019603 | A | | 1/2010 | |
| JP | 2015509605 | A | | 3/2015 | |
| JP | 2015518141 | A | | 6/2015 | |
| JP | 2020523742 | A | | 8/2020 | |
| KR | 20130059107 | A | | 6/2013 | |
| KR | 20130109066 | A | | 10/2013 | |
| KR | 102061281 | B1 | | 12/2019 | |
| KR | 102099414 | B1 | | 4/2020 | |
| KR | 102155207 | B1 | | 9/2020 | |
| KR | 20200109925 | A | | 9/2020 | |
| KR | 20210002971 | A | | 1/2021 | |
| KR | 20210060210 | A | | 5/2021 | |
| KR | 20210073049 | A | * | 6/2021 | G01R 1/206 |
| KR | 20210126860 | A | | 10/2021 | |
| WO | 2021101059 | A1 | | 5/2021 | |

OTHER PUBLICATIONS

Extended European Search Report including Written Opinion for Application No. 23737418.6 dated Dec. 6, 2024, pp. 1-9.

* cited by examiner

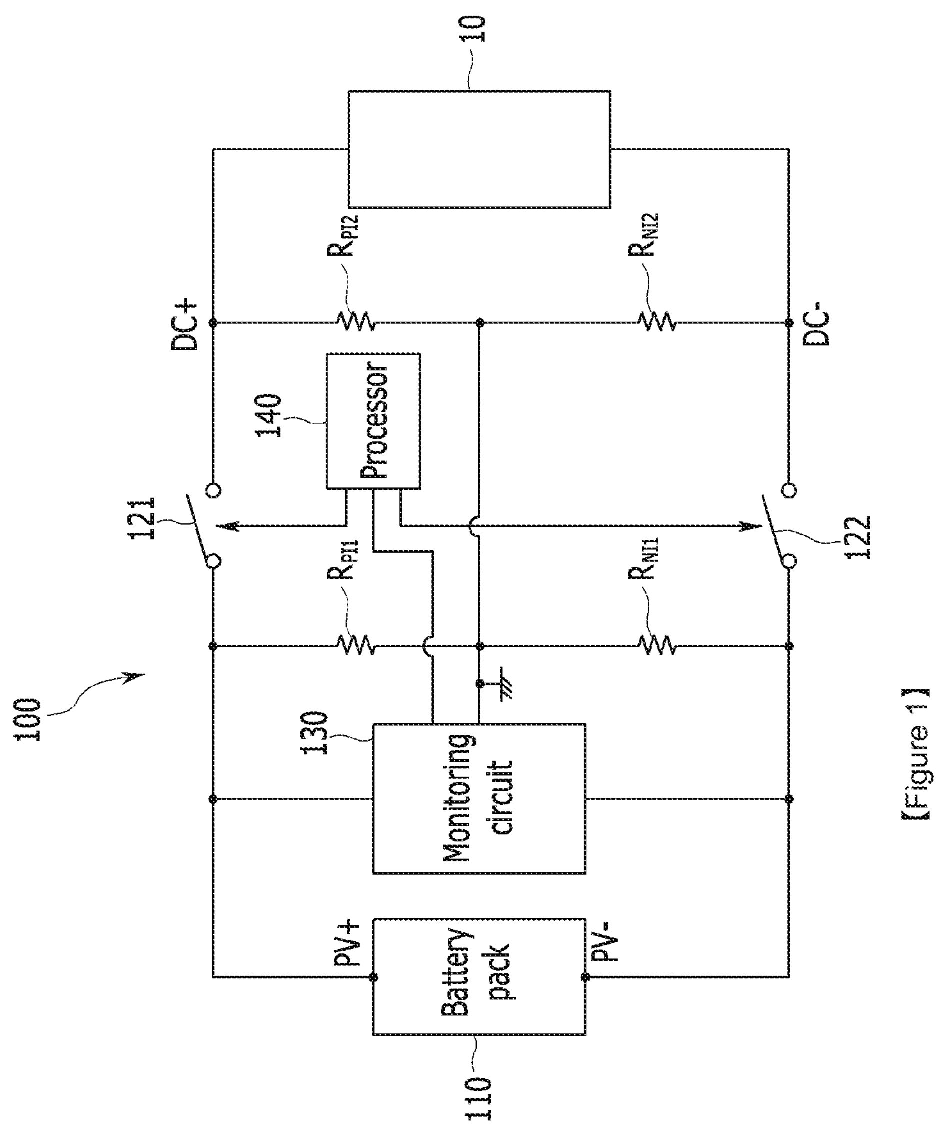
【Figure 1】

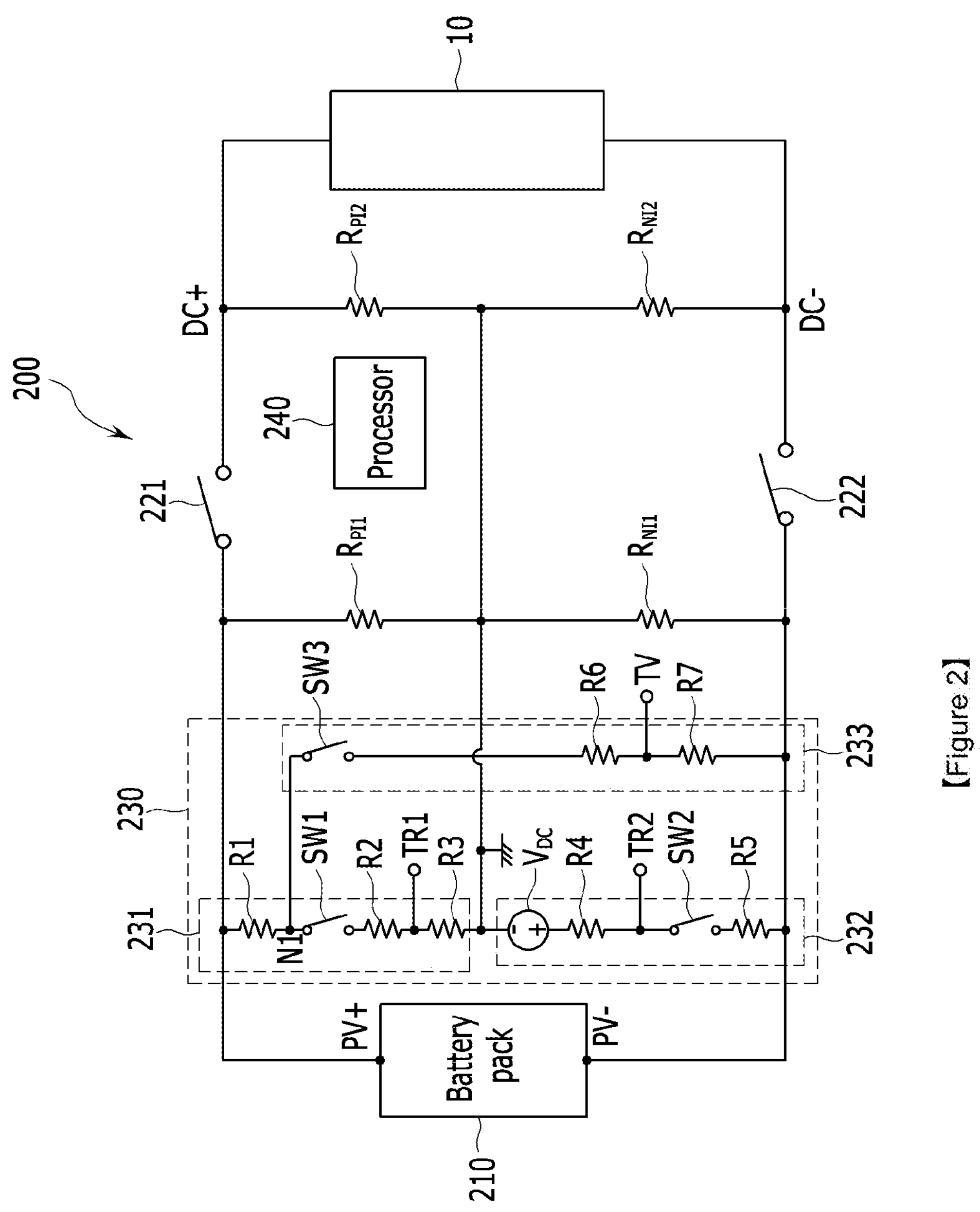
【Figure 2】

【Figure 3】
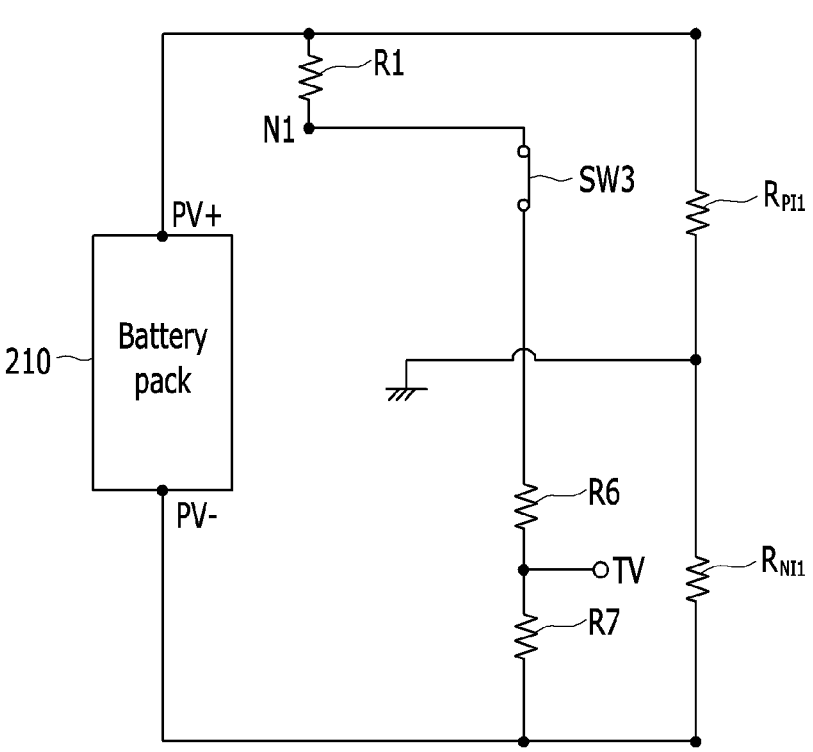

【Figure 4】
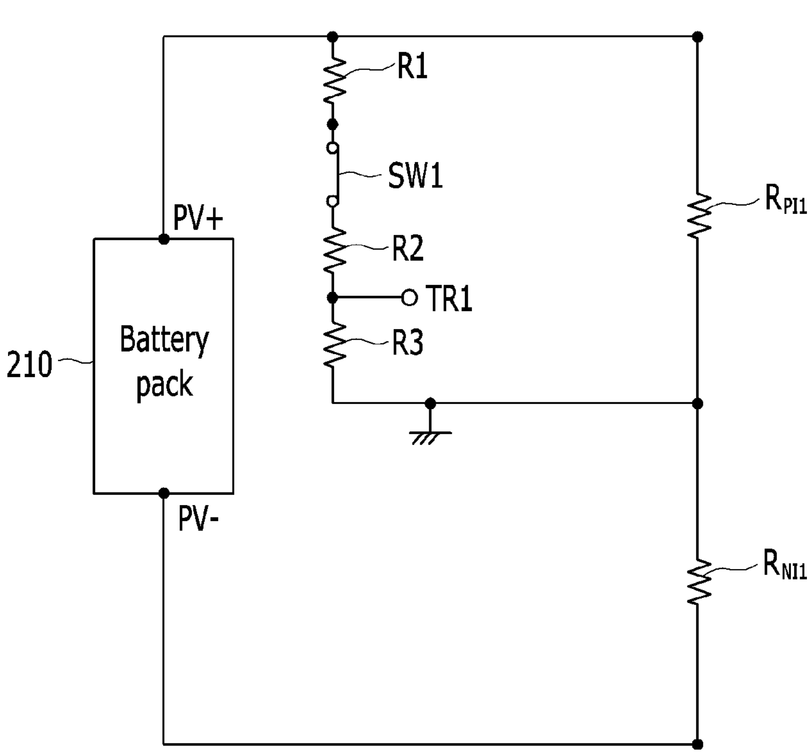

【Figure 5】
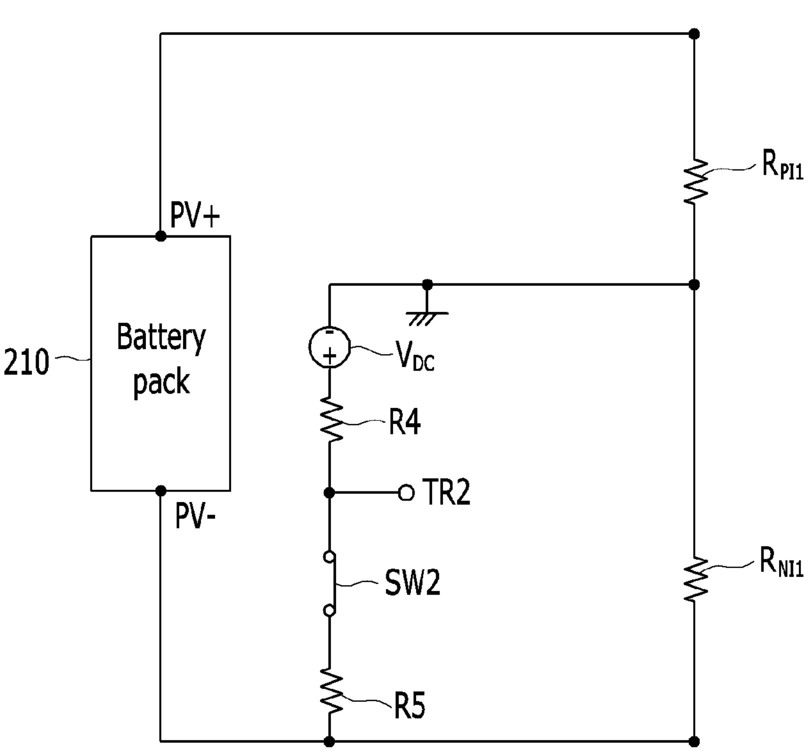

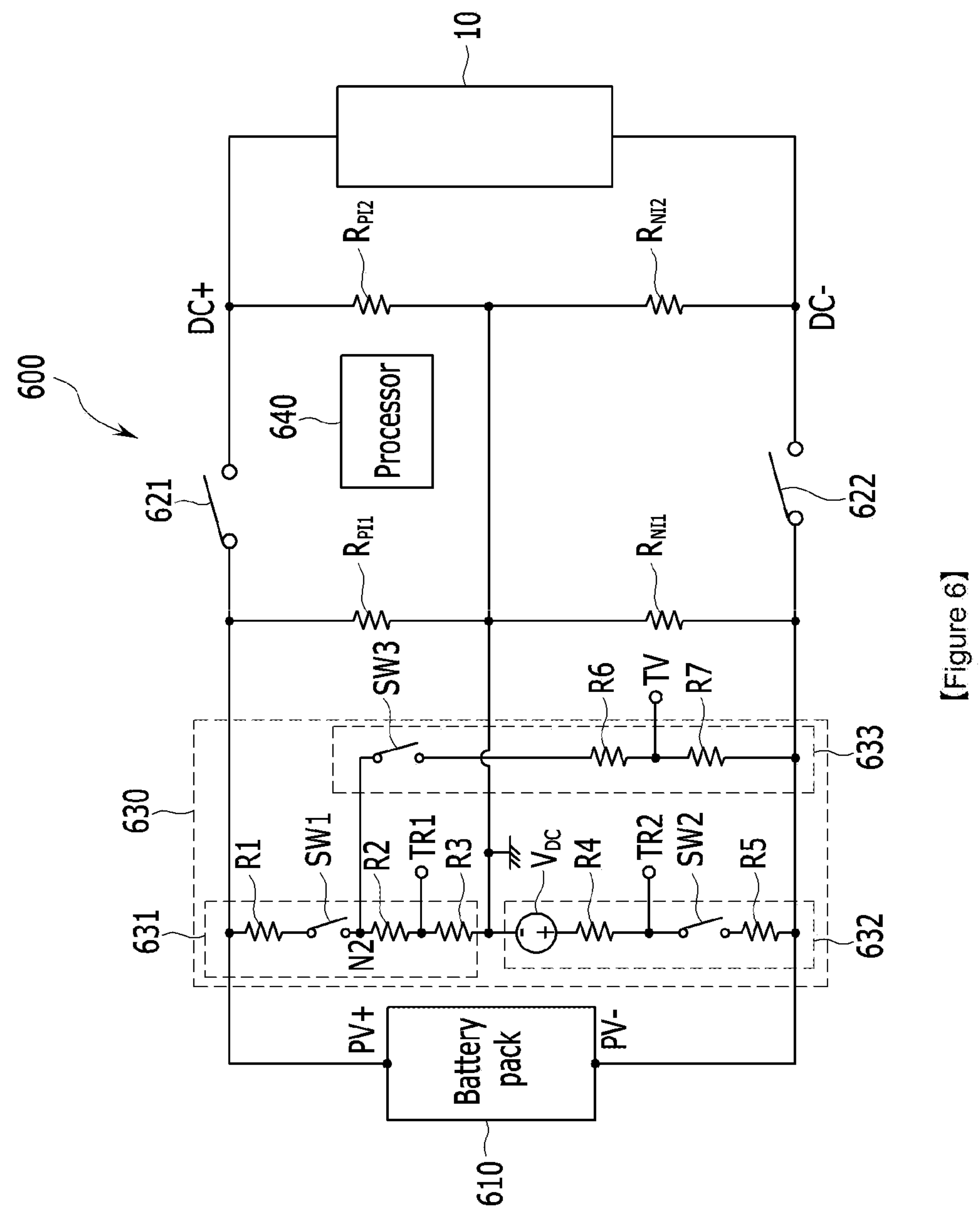
【Figure 6】

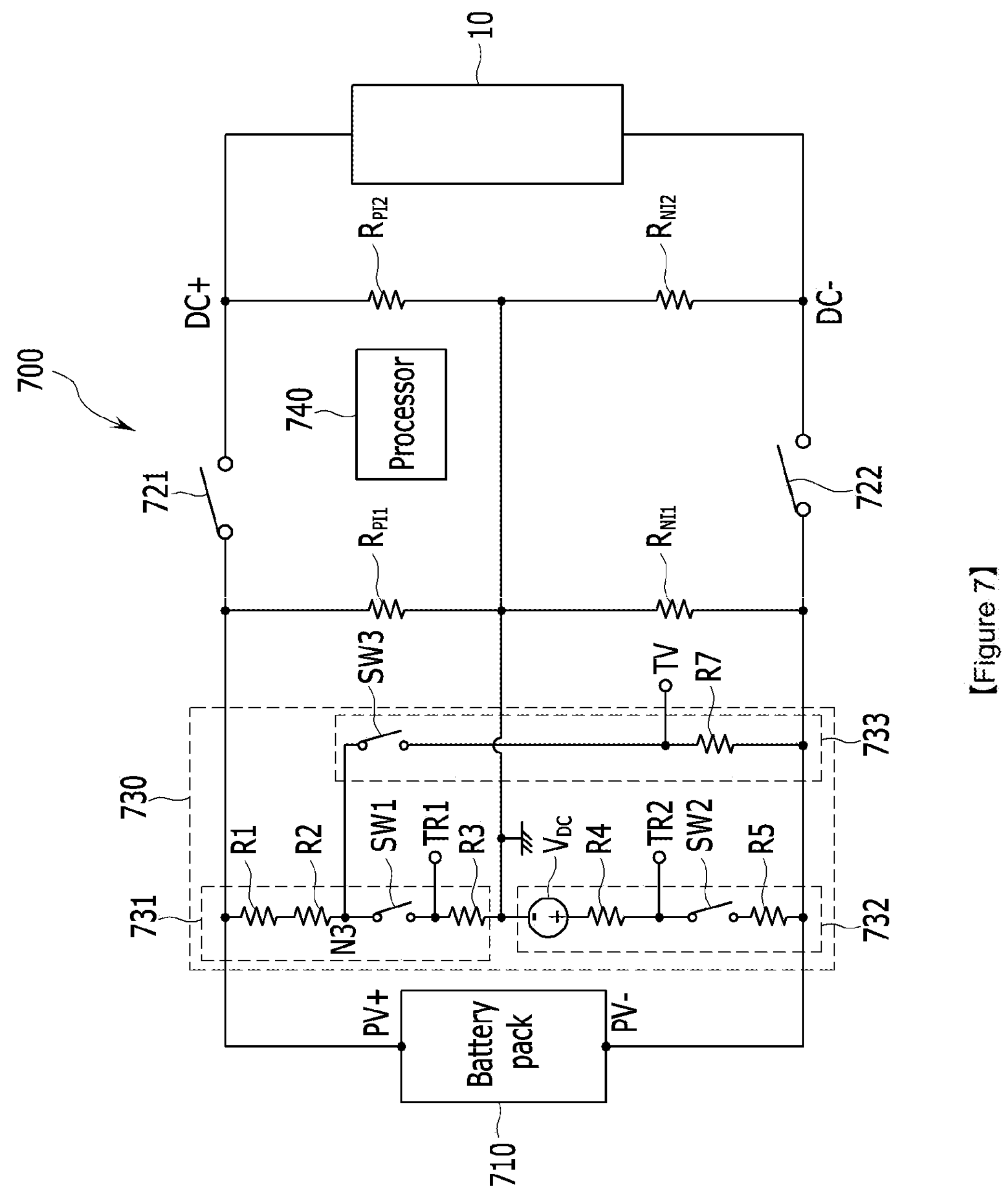
【Figure 7】

BATTERY APPARATUS AND BATTERY MANAGEMENT SYSTEM FOR MEASURING INSULATION RESISTANCE

CROSS-REFERENCE TO RELATED APPLICATIONS

The present application is a national phase entry under 35 U.S.C. § 371 of International Application No. PCT/KR2023/00250 filed Jan. 5, 2023, which claims priority from Korean Patent Application No. 10-2022-0002135 filed Jan. 6, 2022, the entire contents of which are incorporated herein by reference.

TECHNICAL FIELD

The present invention relates to a battery unit and a battery management system for measuring insulation resistance.

BACKGROUND ART

Electric vehicles and hybrid vehicles are vehicles obtaining power by mainly using batteries as power sources for driving motors, and are alternatives capable of solving pollution and energy problems of internal combustion vehicles. For this reason, research has been actively carried out on them. Further, rechargeable batteries have been used in electric vehicles and even in various other external apparatuses.

As high-power high-capacity batteries have been required, battery packs including a plurality of battery cells connected, and battery management systems for managing battery packs have been used. It is important for units using such battery packs to maintain an insulated state. In the case where the insulated state of a battery pack is not maintained, leakage current may occur, resulting in various problems. For this reason, battery management systems use circuits for measuring the insulation resistance of a battery pack in order to prevent leakage current from occurring.

Meanwhile, since battery management systems need circuits for monitoring the high voltage of battery packs as well, the costs of battery management systems may increase due to insulation resistance measurement circuits and high-voltage monitoring circuits.

SUMMARY

Technical Problem

The present invention has been made in an effort to provide a battery unit and a battery management system capable of being integrated with an insulation resistance measurement circuit and a high-voltage monitoring circuit.

Technical Solution

An example embodiment of the present invention provides a battery unit which is connectable to an external device. The battery unit may include a battery pack, a first resistor, a second resistor, a third resistor, a fourth resistor, a fifth resistor, and a processor. The first resistor may be connected between a positive terminal of the battery pack and a node, and the second resistor may be arranged to be connected between the node and a ground terminal of the external device when the battery unit is connected to the external device. The third resistor and the fourth resistor may be arranged to be connected between the ground terminal and a negative terminal of the battery pack when the battery unit is connected to the external device, and the fifth resistor may be connected between the node and the negative terminal of the battery pack. The processor may be configured to measure a voltage of the battery pack based on a voltage of a first terminal of the fifth resistor, and measure a first insulation resistance formed between the positive terminal of the battery pack and the ground terminal and a second insulation resistance formed between the negative terminal of the high voltage of battery packs as well, the costs of battery management systems may increase due to insulation resistance measurement circuits and high-voltage monitoring circuits.

SUMMARY

Technical Problem

The present invention has been made in an effort to provide a battery unit and a battery management system capable of being integrated with an insulation resistance measurement circuit and a high-voltage monitoring circuit.

Technical Solution

An example embodiment of the present invention provides a battery unit which is connectable to an external device. The battery unit may include a battery pack, a first resistor, a second resistor, a third resistor, a fourth resistor, a fifth resistor, and a processor. The first resistor may be connected between a positive terminal of the battery pack and a node, and the second resistor may be arranged to be connected between the node and a ground terminal of the external device when the battery unit is connected to the external device. The third resistor and the fourth resistor may be arranged to be connected between the ground terminal and a negative terminal of the battery pack when the battery unit is connected to the external device, and the fifth resistor may be connected between the node and the negative terminal of the battery pack. The processor may be configured to measure a voltage of the battery pack based on a voltage of a first terminal of the fifth resistor, and measure a first insulation resistance formed between the positive terminal of the battery pack and the ground terminal and a second insulation resistance formed between the negative terminal of the battery pack and the ground terminal, based on a voltage of a first terminal of the second resistor and a voltage of a contact point of the third resistor and the fourth resistor.

In some example embodiments, the battery unit may further include a DC voltage source arranged to be connected between the ground terminal and the negative terminal of the battery pack on a path where the third resistor and the fourth resistor are positioned.

In some example embodiments, the battery unit may further include a first switch and a sixth resistor arranged to be connected between the node and the ground terminal on a path where the second resistors am positioned, a second switch arranged to be connected between the ground terminal and the negative terminal of the battery pack on a path where the third resistor and the fourth resistor am positioned, and a seventh resistor connected between the node and the negative terminal of the battery pack on a path where the fifth resistor is positioned.

In some example embodiments, the battery unit may further include a third switch connected between the node and the negative terminal of the battery pack on a path where the fifth resistor and the seventh resistor are positioned.

In some example embodiments, the processor may be configured to measure the voltage of the battery pack based on a voltage computed by dividing the voltage using resistance of the fifth resistor and the seventh resistor, when the first switch and the second switch are off. Further, the processor may be configured to measure the first insulation resistance and the second insulation resistance based on the voltage of the battery pack, a voltage computed by dividing the voltage using resistances of the second resistor and the sixth resistor when the first switch is on and the second switch are off, and a voltage computed by dividing the voltage using resistances of the third resistor and the fourth resistor when the first switch is off and the second switch are on.

In some example embodiments, the battery unit may further include a first switch connected between the positive terminal of the battery pack and the node on a path where the first resistor is positioned, a sixth resistor connected between the node and the ground terminal on a path where the second resistor is positioned, a second switch arranged to be connected between the ground terminal and the negative terminal of the battery pack on a path where the third resistor and the fourth resistor are positioned, and a seventh resistor connected between the node and the negative terminal of the battery pack on a path where the fifth resistor is positioned.

In some example embodiments, the battery unit may further include a third switch connected between the node and the negative terminal of the battery pack on a path where the fifth resistor and the seventh resistor are positioned.

In some example embodiments, the processor may measure the voltage of the battery pack based on a voltage computed by dividing the voltage using resistances of the fifth resistor and the seventh resistor, when the first switch is on and the second switch is off. Further, the processor may be configured to measure the first insulation resistance and the second insulation resistance based on the voltage of the battery pack, a voltage computed by dividing the voltage using resistances of the second resistor and the sixth resistor when the first switch is on and the second switch is off, and a voltage computed by dividing the voltage using resistances of the third resistor and the fourth resistor when the first switch is off and the second switch is on.

In some example embodiments, the battery unit may further include a first switch arranged to be connected between the node and the ground terminal on a path where the second resistor is positioned, and a second switch arranged to be connected between the ground terminal and the negative terminal of the battery pack on a path where the third resistor and the fourth resistor are positioned.

In some example embodiments, the battery unit may further include a third switch connected between the node and the negative terminal of the battery pack on a path where the fifth resistor is positioned.

In some example embodiments, the processor may be configured to measure the voltage of the battery pack based on a voltage computed by dividing the voltage using resistances of the first resistor and the fifth resistor, when the first switch and the second switch are off. Further, the processor may be configured to measure the first insulation resistance and the second insulation resistance based on the voltage of the battery pack, a voltage computed by dividing the voltage using resistances of the first resistor and the second resistor when the first switch is on and the second switch is off, and a voltage computed by dividing the voltage using resistances of the third resistor and the fourth resistor when the first switch is off and the second switch is on.

Another example embodiment of the present invention provides a battery management system of a battery unit connectable to an external device and including a battery pack. The battery management system may include a first insulation resistance monitoring circuit, a second insulation resistance monitoring circuit, a voltage monitoring circuit, and a processor. The first insulation resistance monitoring circuit may include a first monitoring terminal, and a first resistor arranged to be connected between the positive terminal of the battery pack and a node, and be connected between the positive terminal of the battery pack and a ground terminal of the external device. The second insulation resistance monitoring circuit may include a second monitoring terminal, and arranged to be connected between the ground terminal and a negative terminal of the battery pack. The voltage monitoring circuit may include a third monitoring terminal, and be connected between the node and the negative terminal of the battery pack. The processor may be configured to measure a voltage of the battery pack based on a voltage of the third monitoring terminal, and measure a first insulation resistance formed between the positive terminal of the battery pack and the ground terminal and a second insulation resistance formed between the negative terminal of the battery pack and the ground terminal, based on a voltage of the first monitoring terminal and a voltage of the second monitoring terminal.

In some example embodiments, the first insulation resistance monitoring circuit may include a first switch, a second resistor, and a third resistor connected between the node and the ground terminal, and the first monitoring terminal being connected to a contact point of the second resistor and the third resistor. The second insulation resistance monitoring circuit may include a DC voltage source, a second switch, a fourth resistor, and a fifth resistor connected between the ground terminal and the negative terminal of the battery pack, and the second monitoring terminal being connected to a contact point of the fourth resistor and the fifth resistor. The voltage monitoring circuit may include a sixth resistor and a seventh resistor connected between the node and the negative terminal of the battery pack, and the third monitoring terminal being connected to a contact point of the sixth resistor and the seventh resistor.

In some example embodiments, the processor may be configured to measure the voltage of the battery pack based on the voltage of the third monitoring terminal when the first switch and the second switch are off. Further, the processor may be configured to measure the first insulation resistance and the second insulation resistance based on the voltage of the battery pack, the voltage of the first monitoring terminal measured when the first switch is on and the second switch is off, and the voltage of the second monitoring terminal which is obtained when the first switch is off and the second switch is on.

In some example embodiments, the first insulation resistance monitoring circuit may include a second resistor and a third resistor arranged to be connected between the node and the ground terminal, and a first switch connected between the positive terminal of the battery pack and the node on a path formed by the first resistor, the first monitoring terminal being connected to a contact point of the second resistor and the third resistor. The second insulation resistance monitoring circuit may include a DC voltage source, a second switch, a fourth resistor, and a fifth resistor arranged to be connected between the ground terminal and the negative terminal of the battery pack, the second monitoring terminal may be connected to a contact point of the fourth resistor and the fifth resistor. The voltage monitoring circuit may include a sixth resistor and a seventh resistor connected between the node and the negative terminal of the battery pack, the third monitoring terminal may be connected to a contact point of the sixth resistor and the seventh resistor.

In some example embodiments, the processor may be configured to measure the voltage of the battery pack based on the voltage of the third monitoring terminal, when the first switch is on and the second switch is off. Further, the processor may be configured to measure the first insulation resistance and the second insulation resistance based on the voltage of the battery pack, the voltage of the first monitoring terminal that is obtained when the first switch is on and the second switch is off, and the voltage of the second monitoring terminal measured when the first switch is off and the second switch is on.

In some example embodiments, the first insulation resistance monitoring circuit may include a first switch and a second resistor connected between the node and the ground terminal, the first monitoring terminal being connected to a contact point of the first resistor and the second resistor. The second insulation resistance monitoring circuit may include a DC voltage source, a second switch, a third resistor, and a fourth resistor connected between the ground terminal and the negative terminal of the battery pack, the second monitoring terminal being connected to a contact point of the third resistor and the fourth resistor. The voltage monitoring circuit may include a fifth resistor connected between the node and the negative terminal of the battery pack, the third monitoring terminal being connected to a contact point of the first resistor and the fifth resistor.

In some example embodiments, the processor may be configured to measure the voltage of the battery pack based on the voltage of the third monitoring terminal when the first switch and the second switch are off. Further, the processor may be configured to measure the first insulation resistance and the second insulation resistance based on the voltage of the battery pack, the voltage of the first monitoring terminal measured when the first switch is on and the second switch is off, and the voltage of the second monitoring terminal measured when the first switch is off and the second switch is on.

According to some example embodiments, it is possible to reduce the cost of a battery management system by integrating an insulation resistance measurement circuit and a high-voltage monitoring circuit with it.

BRIEF DESCRIPTION OF THE DRAWINGS

FIG. 1 is a drawing illustrating an example of a battery unit according to an example embodiment of the present invention.

FIG. 2 is a drawing illustrating an example of a battery unit according to another example embodiment of the present invention.

FIG. 3 is a drawing for explaining measurement of the voltage of a battery pack in the battery unit shown in FIG. 2.

FIG. 4 and FIG. 5 each are a drawing for explaining measurement of insulation resistance in the battery unit shown in FIG. 2.

FIG. 6 is a drawing illustrating an example of a battery unit according to another example embodiment of the present invention.

FIG. 7 is a drawing illustrating an example of a battery unit according to another example embodiment of the present invention.

DETAILED DESCRIPTION

In the following detailed description, only certain example embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

It should be understood that when a constituent element is referred to as being "connected" to another constituent element, it may be directly connected to the other constituent element, or other constituent elements may be present between them. In contrast, it should be understood that when a constituent element is referred to as being "directly connected" to another constituent element, there is no other constituent element between them.

In the following description, expressions written in the singular forms can be comprehended as the singular forms or plural forms unless clear expressions such as "a", "an", or "single" are used.

In the flow charts described with reference to the drawings, the order of operations may be changed, and several operations may be combined, and an operation may be divided, and some operations may not be performed.

FIG. 1 is a drawing illustrating an example of a battery unit according to an example embodiment of the present invention.

Referring to FIG. 1, a battery unit 100 has a structure electrically connectable to an external device through its positive link terminal DC+ and its negative link terminal DC−. In the case where the external device is a load, the battery unit 100 may serve as a power source for supplying power to the load, thereby being discharged. In the case where the external device is a charger, the battery unit 100 may receive external power through the charger, thereby being charged. In some example embodiments, the external device serving as a load may be, for example, an electronic apparatus, a transportation means, or an energy storage system (ESS), and the transportation means may be a vehicle such as an electric vehicle, a hybrid vehicle, or smart mobility. In some example embodiments, in the case of a vehicle, the positive link terminal DC+ and the negative link terminal DC− of the battery unit 100 may be connected to inverters (not shown in the drawings), and the battery unit 100 may be connected to the motor of the vehicle serving as a load, through the inverters.

The battery unit 100 includes a battery pack 110, main switches 121 and 122, a monitoring circuit 130, and a processor 140.

The battery pack 110 has a positive terminal PV+ and a negative terminal PV−. The battery pack 110 may include a plurality of battery cells which is connected in series between the positive terminal PV+ and the negative terminal PV−. In some example embodiments, the negative terminal PV− of the battery pack 110 may be connected to a ground terminal of the battery unit. In some example embodiments, the battery pack 110 may include a plurality of battery modules connected in series between the positive terminal PV+ and the negative terminal PV−, and each battery module may include a plurality of battery cells which is connected in series. In some example embodiments, the battery cells may be secondary batteries which are rechargeable.

The main switches 121 and 122 include an anodic main switch 121 that is connected between the positive terminal PV+ of the battery pack 110 and the positive link terminal DC+ of the battery unit 100, and a cathodic main switch 122 that is connected between the negative terminal PV− of the battery pack 110 and the negative connection link terminal DC− of the battery unit 100. The main switches 121 and 122 may electrically connect the battery pack 110 and the external device 10 under control of the processor 140. In some example embodiments, each of the main switches 121 and 122 may include a contactor including a relay. In some example embodiments, each of the main switches 121 and 122 may include an electric switch such as a transistor. In some example embodiments, the battery unit 100 may further include driver circuits (not shown in the drawings) for driving the main switches 121 and 122 in response to control signals from the processor 140, respectively. When the anodic main switch 121 and the cathodic main switch 122 are closed, power can be supplied from the battery pack 110 to the external device, or power can be supplied from the external device to the battery pack 110. Closing a switch may be referred to as turning on the switch, and opening a switch may be referred to as turning off the switch.

Between the positive terminal PV+ of the battery pack 110 and the ground terminal of the external device 10, insulation resistance $R_{PI1}$ of the battery unit 100 is formed, and between the negative terminal PV− of the battery pack 110 and the ground terminal of the external device 10, insulation resistance $R_{NI1}$ of the battery unit 100 is formed. Further, between the positive link terminal DC+ of the battery pack 110 and the ground terminal of the external device 10, insulation resistance $R_{PI2}$ of the external device 10 is formed, and between the negative link terminal DC− of the battery pack 110 and the ground terminal of the external device 10, insulation resistance $R_{NI2}$ of the external device 10 is formed. The ground terminal of the external device 10 may be, for example, the chassis of a vehicle.

The monitoring circuit 130 is connected to the positive terminal PV+ and the negative terminal PV− of the battery pack 110 and the ground terminal of the external device 10, and monitors the voltage of the battery pack 110 and insulation resistance $R_{PI1}$, $R_{PI2}$, $R_{NI1}$, and $R_{PI2}$.

The processor 140 controls the monitoring circuit 130, and measures the voltage and insulation resistance $R_{PI1}$, $R_{PI2}$, $R_{NI1}$, and $R_{NI2}$ of the battery pack 110 on the basis of information from the monitoring circuit 130. Further, the processor 140 controls the operations of the main switches 121 and 122. In some example embodiments, the processor 140 may be, for example, a micro controller unit (MCU).

In some example embodiments, the monitoring circuit 130 and the processor 140 may form a battery management system.

Now, monitoring circuits according to various example embodiments will be described with reference to FIG. 2 to FIG. 9.

FIG. 2 is a drawing illustrating an example of a battery unit according to another example embodiment of the present invention, and FIG. 3 is a drawing for explaining measurement of the voltage of a battery pack in the battery unit shown in FIG. 2, and FIG. 4 and FIG. 5 each are a drawing for explaining measurement of insulation resistance in the battery unit shown in FIG. 2.

Referring to FIG. 2, a battery unit 200 includes a battery pack 210, main switches 221 and 222, a monitoring circuit 230, and a processor 240. The battery pack 210, the main switches 221 and 222, and the processor 240 are similar to the battery pack 110, the main switches 121 and 122, and the processor 140 described with reference to FIG. 1, so a description thereof will not be made.

The monitoring circuit 230 includes a first insulation resistance monitoring circuit 231, a second insulation resistance monitoring circuit 232, and a voltage monitoring circuit 233.

The first insulation resistance monitoring circuit 231 includes a resistor (or a first resistor) R1 that is connected between the positive terminal PV+ of the battery pack 210 and a node N1, and a switch (or a first switch) SW1 and resistors (or second and sixth resistors, or second and third resistors) R2 and R3 that are connected in series between the node N1 and the ground terminal of the external device, and has a first insulation resistance monitoring terminal (or a first monitoring terminal) TR1 on a path which is formed by the resistors R2 and R3 and the switch SW1. The first insulation resistance monitoring terminal TR1 may be connected to one terminal of the resistor R2 or one terminal of the resistor R3. In some example embodiments, a first terminal of the switch SW1 may be connected to the node N1, and the resistor R2 may be connected between a second terminal of the switch SW2 and the monitoring terminal TR1, and the resistor R3 may be connected between the monitoring terminal TR1 and the ground terminal.

In some example embodiments, the order of connection of the switch SW1 and the resistors R2 and R3 between the node N1 and the ground terminal may be changed. In this case, a node through which a voltage that is obtained by voltage division using the resistors R2 and R3 can be output (for example, the contact point of the resistors R2 and R3) may be set as the monitoring terminal TRL.

The second insulation resistance monitoring circuit 232 includes resistors (or third and fourth resistors, or fourth and fifth resistors) R4 and R5 that are connected in series between the ground terminal of the external device and the negative terminal PV− of the battery pack 210, and a switch (or a second switch) SW2, and has a second insulation resistance monitoring terminal (or a second monitoring terminal) TR2 on a path which is formed by the resistors R4 and R5 and the switch SW2. The second insulation resistance monitoring terminal TR2 may be connected to one terminal of the resistor R4 or one terminal of the resistor R5. In some example embodiments, the resistor R4 may be connected between the ground terminal and the monitoring terminal TR2, and a first terminal of the switch SW2 may be connected to the monitoring terminal TR2, and the resistor R5 may be connected between a second terminal of the switch SW2 and the negative terminal PV− of the battery pack 210.

In some example embodiments, the second insulation resistance monitoring circuit 232 may further include a DC voltage source $V_{DC}$ on a path which is formed by the resistors R4 and R5 and the switch SW2. Since the resistors R4 and R5 are connected between the negative terminal PV− of the battery pack 210 and the ground terminal, the DC voltage source $V_{DC}$ c ay be provided such that the voltage of the second insulation resistance monitoring terminal TR2 can become a positive voltage. In some example embodiments, the anode of the DC voltage source $V_{DC}$ may be connected to the ground terminal, and the cathode of the DC voltage source $V_{DC}$ may be connected to one terminal of the resistor R4.

In some example embodiments, the order of connection of the DC voltage source $V_{DC}$, the resistors R4 and R5, and the switch SW2 between the ground terminal and the negative terminal PV− of the battery pack 210 may be changed. In this case, a node through which a voltage that is obtained by voltage division using the resistors R4 and R5 can be output (for example, the contact point of the resistors R4 and R5) may be set as the monitoring terminal TR2.

The voltage monitoring circuit 233 includes a switch (or a third switch) SW3 and resistors (or fifth and seventh resistors, or sixth and seventh resistors) R6 and R7 that are connected in series between one node N1 in the first insulation resistance monitoring circuit 231 and the negative terminal PV− of the battery pack 210, and has a voltage monitoring terminal (or a third monitoring terminal) TV on a path which is formed by the switch SW3 and the resistors R6 and R7. The voltage monitoring terminal TV may be connected to one terminal of the resistor R6 or one terminal of the resistor R7. In some example embodiments, a first terminal of the switch SW3 may be connected to the node N1 of the first insulation resistance monitoring circuit 231, and the resistor R6 may be connected between a second terminal of the switch SW3 and the voltage monitoring terminal TV, and the resistor R7 may be connected between the voltage monitoring terminal TV and the negative terminal PV− of the battery pack 210.

In some example embodiments, the order of connection of the switch SW3 and the resistors R6 and R7 between the node N1 and the negative terminal PV− of the battery pack 210 may be changed. In this case, a node through which a voltage that is obtained by voltage division using the resistors R6 and R7 can be output (for example, the contact point of the resistors R6 and R7) may be set as the monitoring terminal TV.

The processor 240 may control the operations of the switches SW1, SW2, and SW3, and measure the voltage of the battery pack 210 on the basis of the voltage of the voltage monitoring terminal TV, and measure the insulation resistance $R_{PI1}$ and $R_{PI2}$ on the basis of the voltage of the battery pack 210, the voltage of the first insulation resistance monitoring terminal TR1, and the voltage of the second insulation resistance monitoring terminal TR2.

In some example embodiments, the battery unit 200 may further include an analog-to-digital converter that converts the voltage of the first insulation resistance monitoring terminal TR1 into a digital signal and transmits the digital signal to the processor 240, an analog-to-digital converter that converts the voltage of the second insulation resistance monitoring terminal TR2 into a digital signal and transmits the digital signal to the processor 240, and an analog-to-digital converter that converts the voltage of the voltage monitoring terminal TV into a digital signal and transmits the digital signal to the processor 240.

Now, a method of measuring the insulation resistance and the battery pack voltage in the battery unit shown in FIG. 2 will be described.

First, battery pack voltage measurement will be described with reference to FIG. 3.

The processor 240 turns on the switch SW3 in the state where the switches SW1 and SW2 are off. Then, a current path passing through the resistors R1, R6, and R7 may be formed between the positive terminal PV+ of the battery pack 210 and the negative terminal PV− of the battery pack 210, as shown in FIG. 3. However, since the switches SW1 and SW2 are off, any current path is not formed between the node N1 and the ground terminal of the external device and between the ground terminal and the negative terminal PV− of the battery pack 210. Therefore, the voltage $V_{PACK}$ of the battery pack 210 can be divided by the resistors R1, R6, and R7 as shown in Equation 1, whereby the fraction thereof can be output as the voltage $V_P$ of the voltage monitoring terminal TV. The processor 240 may measure the voltage $V_{PACK}$ of the battery pack 210 on the basis of the voltage $V_P$ of the voltage monitoring terminal TV.

$$V_P = \frac{R_7}{R_1 + R_6 + R_7} V_{PACK} \quad \text{(Equation 1)}$$

In Equation 1, $R_1$, $R_6$, and $R_7$ are the resistance values of the resistors R1, R6, and R7, respectively.

Now, insulation resistance measurement will be described with reference to FIG. 4 and FIG. 5.

Referring to FIG. 4, the processor 240 turns on the switch SW1 in the state where the switch SW2 is off and the switch SW3 is on. In some example embodiments, the processor 240 may turn off the switch SW3. By turning on the switch SW1, a current path passing through the resistors R1, R2, and R3 is formed between the positive terminal PV+ of the battery pack 210 and the ground terminal of the external device. However, since the switch SW2 is off, any current path passing through the resistors R4 and R5 is not formed. In this case, between the positive terminal PV+ of the battery pack 210 and the ground terminal of the external device, the insulation resistance $R_{PI1}$ is formed. Therefore, between the positive terminal PV+ of the battery pack 210 and the ground terminal of the external device, a circuit in which the set of resistors R1, R2, and R3 and the insulation resistance $R_{PI1}$ are connected in parallel is formed. Further, between the ground terminal and the negative terminal PV− of the battery pack 210, a circuit in which the insulation resistance $R_{NI1}$ is connected is formed. In this state, the processor 240 receives the voltage $V_1$ of the first insulation resistance monitoring terminal TR1. The relationship between the voltage $V_{PACK}$ of the battery pack 210 and the voltage $V_1$ of the first insulation resistance monitoring terminal TR1 in the circuit shown in FIG. 4 may be determined as shown in Equation 2. In the case where the switch SW3 is turned on, a current path passing through the resistors R6 and R7 is formed; however, for ease of explanation, it is assumed that the resistance values of the resistors R6 and R7 are so large that the current flowing through the resistors R6 and R7 can be ignored in Equation 2.

$$V_{PACK} = \frac{V_1}{R_3}(R_1 + R_2) + V_1 + \left( \frac{V_1}{R_3} + \frac{\frac{V_1}{R_3}(R_1 + R_2) + V_1}{R_{PI1}} \right) R_{NI1} \quad \text{(Equation 2)}$$

In Equation 2, $R_1$, $R_2$, $R_3$, $R_{PI1}$, and $R_{NI1}$ are the resistance values of the resistors $R_1$, $R_2$, and $R_3$ and the resistance values of the resistance $R_{PI1}$ and $R_{NI1}$, respectively.

Referring to FIG. 5, the processor 240 turns on the switch SW2 in the state where the switch SW1 is off and the switch SW3 is on. In some example embodiments, the processor 240 may turn off the switch W3. By turning on the switch SW2, a current path passing through the voltage source $V_{DC}$ and the resistors R4 and R5 is formed between the ground terminal of the external device and the negative terminal PV− of the battery pack 210. However, since the switch SW1 is off, any current path passing through the resistors R1, R2, and R3 is not formed. In this case, the insulation resistance $R_{NI1}$ is formed between the ground terminal and the negative terminal PV− of the battery pack 210. Therefore, between the ground terminal and the negative terminal PV− of the battery pack 210, a circuit in which the set of resistors R4 and R5 and the insulation resistance $R_{NI1}$ are connected in parallel is formed. Further, between the positive terminal PV+ of the battery pack 210 and the ground terminal of the external device, a circuit in which the insulation resistance $R_{PI1}$ is connected is formed. In this state, the processor 240 receives the voltage $V_2$ of the second insulation resistance monitoring terminal TR2. The relationship between the voltage $V_{PACK}$ of the battery pack 210 and the voltage $V_2$ of the second insulation resistance monitoring terminal TR2 in the circuit shown in FIG. 5 may be determined as shown in Equation 3. In the case where the switch SW3 is turned on, a current path passing through the resistors R6 and R7 is formed; however, for ease of explanation, it is assumed that the resistance values of the resistors R6 and R7 are so large that the current flowing through the resistors R6 and R7 can be ignored in Equation 3.

$$V_{PACK} = \frac{V_{DC}-V_2}{R_4}R_5 - V_2 + \left(\frac{V_{DC}-V_2}{R_4} + \frac{\frac{V_{DC}-V_2}{R_4}R_5 - V_2}{R_{NI1}}\right)R_{PI1} \quad \text{(Equation 3)}$$

In Equation 3, $R_4$, $R_5$, $R_{PI1}$, and $R_{NI1}$ are the resistance values of the resistors $R_4$ and $R_5$ and the resistance values of the resistance $R_{PI1}$ and $R_{NI1}$, respectively.

The processor 240 calculates the resistance values of the insulation resistance $R_{PI1}$ and $R_{NI1}$ on the basis of the voltage $V_1$ of the first insulation resistance monitoring terminal TR1, the voltage $V_2$ of the second insulation resistance monitoring terminal TR2, and the voltage $V_{PACK}$ of the battery pack 210. The processor 240 may calculate the resistance values of the insulation resistance $R_{PI1}$ and $R_{NI1}$ on the basis of Equations 2 and 3 as shown in Equations 4 and 5.

$$R_{PI1} = \frac{(V_{PACK}-A)(V_{PACK}-C)-AC}{D(V_{PACK}-A)+BC} \quad \text{(Equation 4)}$$

$$R_{NI1} = \frac{(V_{PACK}-A)(V_{PACK}-C)-AC}{B(V_{PACK}-A)+AD} \quad \text{(Equation 5)}$$

In Equations 4 and 5, A, B, C, and D can be defined as shown in Equations 6, 7, 8, and 9, respectively.

$$A = \frac{V_1}{R_3}(R_1+R_2)+V_1 \quad \text{(Equation 6)}$$

$$B = \frac{V_1}{R_3} \quad \text{(Equation 7)}$$

$$C = \frac{V_{DC}-V_2}{R_4}R_5 - V_2 \quad \text{(Equation 8)}$$

$$D = \frac{V_{DC}-V_2}{R_4} \quad \text{(Equation 9)}$$

Meanwhile, in the case where the main switches 221 and 222 are turned on, in the circuits shown in FIG. 4 and FIG. 5, the insulation resistance $R_{PI2}$ of the external device is connected in parallel with the insulation resistance $R_{PI1}$ of the battery unit, and the insulation resistance $R_{NI2}$ of the external device is connected in parallel with the insulation resistance $R_{NI1}$ of the battery unit. Therefore, the processor 240 may calculate the resistance values of the insulation resistance $R_{PI1}$ and $R_{PI2}$ connected in parallel through the process described with reference to Equations 2 to 9 and the resistance values of the insulation resistance $R_{NI1}$ and $R_{NI2}$ connected in parallel. The processor 240 may calculate the resistance values of the insulation resistance $R_{PI2}$ and $R_{NI2}$ of the external device on the basis of the resistance values of the insulation resistance $R_{PI1}$ and $R_{NI1}$ measured when the main switches 221 and 222 were off and the resistance values of the insulation resistance $R_{PI1}//R_{PI2}$ and $R_{NI1}//R_{NI2}$ measured when the main switches 221 and 222 were on.

According to the example embodiments described above, the insulation resistance monitoring circuits 231 and 232 and the voltage monitoring circuit 233 may share the resistor R1, whereby it is possible to reduce the cost of the battery management system as compared to the case where the insulation resistance monitoring circuits 231 and 232 and the voltage monitoring circuit 233 may have separate resistors connected to the positive terminal PV+ of the battery pack 210.

FIG. 6 is a drawing illustrating an example of a battery unit according to another example embodiment.

Referring to FIG. 6, a battery unit 600 includes a battery pack 610, main switches 621 and 622, a monitoring circuit 630, and a processor 640. The battery pack 610, the main switches 621 and 622, and the processor 640 are similar to the battery pack 110, the main switches 121 and 122, and the processor 140 described with reference to FIG. 1, so a description thereof will not be made. The monitoring circuit 630 includes a first insulation resistance monitoring circuit 631, a second insulation resistance monitoring circuit 632, and a voltage monitoring circuit 633. The monitoring circuit 630 is similar to the monitoring circuit 230 described with reference to FIG. 2, and the differences between them will be described.

A node N2 in the first insulation resistance monitoring circuit 631 to which the voltage monitoring circuit 633 is connected may be the contact point of the switch SW1 and the resistor R2. In other words, in the voltage monitoring circuit 633, the switch SW3 may be connected to the second terminal N2 of the switch SW1 of the first insulation resistance monitoring circuit 231. In some example embodiments, the first terminal of the switch SW3 may be connected to the second terminal N2 of the switch SW1, and the resistor R6 may be connected between the second terminal of the switch SW3 and the voltage monitoring terminal TV.

In this case, in order to measure the voltage of the battery pack 610, the processor 640 turns on the switches SW1 and SW3 when the switch SW2 is off. By turning on the switches SW1 and SW3, a current path passing through the resistors R1, R2, and R3 is formed between the positive terminal PV+ of the battery pack 610 and the ground terminal of the external device. In order to measure the insulation resistance $R_{PI1}$, $R_{NI1}$, $R_{PI2}$, and $R_{NI2}$, the processor 640 performs the same operation as that of the processor 240 shown in FIG. 2.

FIG. 7 is a drawing illustrating an example of a battery unit according to another example embodiment of the present invention.

Referring to FIG. 7, a battery unit 700 includes a battery pack 710, main switches 721 and 722, a monitoring circuit 730, and a processor 740. The battery pack 710, the main switches 721 and 722, and the processor 740 are similar to the battery pack 110, the main switches 121 and 122, and the processor 140 described with reference to FIG. 1, so a description thereof will not be made. The monitoring circuit 730 includes a first insulation resistance monitoring circuit 731, a second insulation resistance monitoring circuit 732, and a voltage monitoring circuit 733. The monitoring circuit 730 is similar to the monitoring circuit 230 described with reference to FIG. 2, and the differences between them will be described.

In the first insulation resistance monitoring circuit 731, the switch SW1 may be connected between the resistor R2 and the resistor (or the second resistor) R3, and a node N3 in the first insulation resistance monitoring circuit 731 to which the voltage monitoring circuit 733 is connected may be the contact point of the resistor R2 and the switch SW1. In some example embodiments, the resistor R2 may be connected between one terminal of the resistor R1 and the node N3, and the switch SW1 may be connected between the node N3 and the first insulation resistance monitoring terminal TR1, and the resistor R3 may be connected between the first insulation resistance monitoring terminal TR1 and the ground terminal of the external device. The switch SW3 in the voltage monitoring circuit 733 may be connected to the node N3. In some example embodiments, the voltage monitoring circuit 733 may not include the resistor R6, and the switch SW3 may be connected between the node N3 and the voltage monitoring terminal TV. In some example embodiments, the resistors R1 and R2 of the first insulation resistance monitoring circuit 731 may be replaced with one resistor.

In this case, in order to measure the voltage of the battery pack 710 and the insulation resistance, the processor 740 performs the same operation as that of the processor 240 shown in FIG. 2.

In some example embodiments, the switch SW3 of the voltage monitoring circuit 233, 633, or 733 may be removed from the circuits shown in FIG. 2, FIG. 6, and FIG. 7, whereby it is possible to further reduce the cost of the battery management system. In some example embodiments, a resistor having a large resistance value may be used in the voltage monitoring circuit 233, 633, or 733. If the switch SW3 is removed, leakage current through a resistor of the voltage monitoring circuit 233, 633, or 733 may occur; however, when a resistor having a large resistance value is used, leakage current can be ignored.

While this invention has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

The invention claimed is:

1. A battery unit which is connectable to an external device, comprising:

a battery pack;

a first resistor connected between a positive terminal of the battery pack and a node, wherein a first electrical path extends from the node to a negative terminal of the battery pack and a second electrical path extends from the node to the negative terminal in parallel to the first electrical path;

a second resistor arranged to be connected between the node and a ground terminal of the external device positioned on the first electrical path, when the battery unit is connected to the external device;

a third resistor and a fourth resistor arranged to be connected between the ground terminal and the negative terminal of the battery pack positioned between the node and the ground terminal positioned on the first electrical path, when the battery unit is connected to the external device;

a fifth resistor connected between the node and the negative terminal of the battery pack positioned on the second electrical path; and a processor configured to measure a voltage of the battery pack based on a voltage of a first terminal of the fifth resistor, and measure a first insulation resistance formed between the positive terminal of the battery pack and the ground terminal and a second insulation resistance formed between the negative terminal of the battery pack and the ground terminal based on a voltage of a first terminal of the second resistor and a voltage of a contact point of the third resistor and the fourth resistor.

2. The battery unit of claim 1, further comprising:

A DC voltage source arranged to be connected between the ground terminal and the negative terminal of the battery pack on the first electrical path.

3. The battery unit of claim 1, further comprising:

A first switch and a sixth resistor arranged to be connected between the node and the ground terminal on first electrical path;

A second switch arranged to be connected between the ground terminal and the negative terminal of the battery pack on the first electrical path; and a seventh resistor connected between the node and the negative terminal of the battery pack on the second electrical path.

4. The battery unit of claim 3, further comprising:

a third switch connected between the node and the negative terminal of the battery pack on the second electrical path.

5. The battery unit of claim 3, wherein:

the processor is configured to perform the following:

measuring the voltage of the battery pack based on a voltage computed by dividing the voltage using resistances of the fifth resistor and the seventh resistor, when the first switch and the second switch are off; and measuring the first insulation resistance and the second insulation resistance based on the voltage of the battery pack, a voltage computed by dividing the voltage using resistances of the second resistor and the sixth resistor when the first switch is on and the second switch are off, and a voltage computed by dividing the voltage using resistances of the third resistor and the fourth resistor when the first switch is off and the second switch are on.

6. The battery unit of claim 1, further comprising:

a first switch connected between the positive terminal of the battery pack and the node on the first electrical path;

a sixth resistor connected between the node and the ground terminal on the first electrical path;

a second switch arranged to be connected between the ground terminal and the negative terminal of the battery pack on the first electrical path; and a seventh resistor connected between the node and the negative terminal of the battery pack on the second electrical path.

7. The battery unit of claim 6, further comprising:

a third switch connected between the node and the negative terminal of the battery pack on the second electrical path.

8. The battery unit of claim 6, wherein:

the processor performs the following:

measuring the voltage of the battery pack based on a voltage computed by dividing the voltage using resistances of the fifth resistor and the seventh resistor, when the first switch is on and the second switch is off; and measuring the first insulation resistance and the second insulation resistance based on the voltage of the battery pack, a voltage computed by dividing the voltage using resistances of the second resistor and the sixth resistor when the first switch is on and the second switch is off, and a voltage computed by dividing the voltage using resistances of the third resistor and the fourth resistor when the first switch is off and the second switch is on.

9. The battery unit of claim 1, further comprising:

A first switch arranged to be connected between the node and the ground terminal on a path where the second resistor is positioned; and A second switch arranged to be connected between the ground terminal and the negative terminal of the battery pack on a path where the third resistor and the fourth resistor are positioned.

10. The battery unit of claim 9, further comprising:

a third switch connected between the node and the negative terminal of the battery pack on a path where the fifth resistor is positioned.

11. The battery unit of claim 9, wherein:

The processor is configured to:

measure the voltage of the battery pack based on a voltage computed by dividing the voltage using resistances of the first resistor and the fifth resistor, when the first switch and the second switch are off; and measure the first insulation resistance and the second insulation resistance based on the voltage of the battery pack, a voltage computed by dividing the voltage using resistances of the first resistor and the second resistor when the first switch is on and the second switch is off, and a voltage computed by dividing the voltage using resistances of the third resistor and the fourth resistor when the first switch is off and the second switch is on.

12. A battery management system of a battery unit connectable to an external device and including a battery pack, comprising:

A first insulation resistance monitoring circuit that includes a first monitoring terminal, and a first resistor connected between a positive terminal of the battery pack and a node, and is arranged to be connected between the positive terminal of the battery pack and a ground terminal of the external device on a first electrical path, wherein the first electrical path extends from the node to a negative terminal of the battery pack and a second electrical path extends from the node to the negative terminal in parallel to the first electrical path;

A second insulation resistance monitoring circuit that includes a second monitoring terminal, and is arranged to be connected between the ground terminal and a negative terminal of the battery pack on the first electrical path;

a voltage monitoring circuit that includes a third monitoring terminal, and is connected between the node and the negative terminal of the battery pack on the second electrical path; and a processor configured to measure a voltage of the battery pack based on a voltage of the third monitoring terminal, and measures a first insulation resistance formed between the positive terminal of the battery pack and the ground terminal and a second insulation resistance formed between the negative terminal of the battery pack and the ground terminal, based on a voltage of the first monitoring terminal and a voltage of the second monitoring terminal.

13. The battery management system of claim 12, wherein:

the first insulation resistance monitoring circuit further includes a first switch, a second resistor, and a third resistor connected between the node and the ground terminal on the first electrical path, and the first monitoring terminal being connected to a contact point of the second resistor and the third resistor, and the second insulation resistance monitoring circuit further includes a DC voltage source, a second switch, a fourth resistor, and a fifth resistor connected between the ground terminal and the negative terminal of the battery pack on the first electrical path, and the second monitoring terminal being connected to a contact point of the fourth resistor and the fifth resistor, and the voltage monitoring circuit further includes a sixth resistor and a seventh resistor connected between the node and the negative terminal of the battery pack on the second electrical path, and the third monitoring terminal being connected to a contact point of the sixth resistor and the seventh resistor.

14. The battery management system of claim 13, wherein:

the processor is configured to:

measure the voltage of the battery pack based on the voltage of the third monitoring terminal when the first switch and the second switch are off; and measure the first insulation resistance and the second insulation resistance based on the voltage of the battery pack, the voltage of the first monitoring terminal measured when the first switch is on and the second switch is off, and the voltage of the second monitoring terminal measured when the first switch is off and the second switch is on.

15. The battery management system of claim 12, wherein:

the first insulation resistance monitoring circuit further includes a second resistor and a third resistor arranged to be connected between the node and the ground terminal, and a first switch connected between the positive terminal of the battery pack and the node on the first electrical path, the first monitoring terminal being connected to a contact point of the second resistor and the third resistor, and the second insulation resistance monitoring circuit further includes a DC voltage source, a second switch, a fourth resistor, and a fifth resistor arranged to be connected between the ground terminal and the negative terminal of the battery pack on the first electrical path, the second monitoring terminal being connected to a contact point of the fourth resistor and the fifth resistor, and the voltage monitoring circuit further includes a sixth resistor and a seventh resistor connected between the node and the negative terminal of the battery pack on the second electrical path, the third monitoring terminal being connected to a contact point of the sixth resistor and the seventh resistor.

16. The battery management system of claim 15, wherein:

the processor is configured to:

measuring the voltage of the battery pack based on the voltage of the third monitoring terminal, when the first switch is on and the second switch is off; and measuring the first insulation resistance and the second insulation resistance based on the voltage of the battery pack, the voltage of the first monitoring terminal measured when the first switch is on and the second switch is off, and the voltage of the second monitoring terminal measured when the first switch is off and the second switch is on.

17. The battery management system of claim 12, wherein:

the first insulation resistance monitoring circuit further includes a first switch and a second resistor connected between the node and the ground terminal on the first electrical path, the first monitoring terminal being connected to a contact point of the first resistor and the second resistor, and the second insulation resistance monitoring circuit further includes a DC voltage source, a second switch, a third resistor, and a fourth resistor connected between the ground terminal and the negative terminal of the battery pack on the first electrical path, the second monitoring terminal being connected to a contact point of the third resistor and the fourth resistor, and the voltage monitoring circuit further includes a fifth resistor connected between the node and the negative terminal of the battery pack on the second electrical path, the third monitoring terminal being connected to a contact point of the first resistor and the fifth resistor.

18. The battery management system of claim 17, wherein:

the processor is configured to:

measure the voltage of the battery pack based on the voltage of the third monitoring terminal when the first switch and the second switch are off; and measure the first insulation resistance and the second insulation resistance based on the voltage of the battery pack, the voltage of the first monitoring terminal measured when the first switch is on and the second switch is off, and the voltage of the second monitoring terminal measured when the first switch is off and the second switch is on.

* * * * *